(12) United States Patent
Huang et al.

(10) Patent No.: US 11,264,296 B2
(45) Date of Patent: Mar. 1, 2022

(54) HERMETICALLY SEALED PACKAGE

(71) Applicant: Corning Incorporated, Corning, NY (US)

(72) Inventors: Ming-Huang Huang, Ithaca, NY (US); Hoon Kim, Horseheads, NY (US); Xu Ouyang, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 158 days.

(21) Appl. No.: 16/529,229

(22) Filed: Aug. 1, 2019

(65) Prior Publication Data
US 2020/0051883 A1 Feb. 13, 2020

Related U.S. Application Data

(60) Provisional application No. 62/715,523, filed on Aug. 7, 2018.

(51) Int. Cl.
*H01L 23/31* (2006.01)
*H01L 21/56* (2006.01)
*B81B 7/00* (2006.01)
*H01L 21/02* (2006.01)
(Continued)

(52) U.S. Cl.
CPC ........ *H01L 23/3142* (2013.01); *B81B 7/0041* (2013.01); *H01L 21/0228* (2013.01); *H01L 21/02422* (2013.01); *H01L 21/56* (2013.01); *H01L 21/76871* (2013.01); *H01L 23/3121* (2013.01); *H01L 23/49838* (2013.01)

(58) Field of Classification Search
CPC ............. H01L 23/3142; H01L 21/0228; H01L 21/02422; H01L 21/56; H01L 21/76871; H01L 23/3121; H01L 23/49838; B81B 7/0041

USPC .................. 257/787, 788; 438/112, 124, 127
See application file for complete search history.

(56) References Cited

U.S. PATENT DOCUMENTS

| 5,834,840 A | 11/1998 | Robbins et al. |
| 6,368,899 B1 | 4/2002 | Featherby et al. |
| 7,405,880 B2 | 7/2008 | Nikolov et al. |

(Continued)

FOREIGN PATENT DOCUMENTS

WO 2019023213 A1 1/2019

OTHER PUBLICATIONS

Douglass; "DMD Reliability: A MEMS Success Story"; Proceedings of SPIE, vol. 4980; (2003) 11 Pages http://blogs.epfl.ch/mems/documents/Reliability%20dmd.pdf.

(Continued)

*Primary Examiner* — Thinh T Nguyen (57) ABSTRACT

An electrical component package includes a glass substrate, an interposer panel positioned on the glass substrate, the interposer panel comprising a device cavity, a wafer positioned on the interposer panel such that the device cavity is enclosed by the glass substrate, the interposer panel, and the wafer. The electrical component package further includes a metal seed layer disposed between the interposer panel and the wafer, and a dielectric coating. The dielectric coating hermetically seals the interposer panel to the glass substrate, the interposer panel to the metal seed layer and the wafer, and the interposer panel hermetically seals the metal seed layer to the glass substrate such that the device cavity is hermetically sealed from ambient atmosphere.

11 Claims, 10 Drawing Sheets

(51) Int. Cl.
*H01L 21/768* (2006.01)
*H01L 23/498* (2006.01)

(56) References Cited

U.S. PATENT DOCUMENTS

| | | |
|---|---|---|
| 7,426,067 B1 | 9/2008 | Bright et al. |
| 9,340,451 B2 | 5/2016 | Boek et al. |
| 2007/0161158 A1 | 7/2007 | Shao et al. |
| 2008/0248613 A1 | 10/2008 | Chen et al. |
| 2009/0289349 A1 | 11/2009 | Novotny et al. |
| 2012/0067871 A1 | 3/2012 | Sherrer et al. |
| 2014/0335301 A1* | 11/2014 | Van'T Oever ...... B81C 1/00269 428/78 |
| 2017/0073266 A1 | 3/2017 | Amosov et al. |
| 2017/0285328 A1 | 10/2017 | Shinohara |

OTHER PUBLICATIONS

International Search Report and Written Opinion of the European International Searching Authority; PCT/US2019/044297; dated Nov. 4, 2019; 12 Pgs.

* cited by examiner

HERMETICALLY SEALED PACKAGE

This application claims the benefit of priority to U.S. Provisional Application Ser. No. 62/715,523 filed on Aug. 7, 2018, the content of which is relied upon and incorporated herein by reference in its entirety.

BACKGROUND

Field

The present specification generally relates to devices and methods for hermetically sealing electronic components, such as microelectromechanical systems (MEMS), and more specifically, to devices and methods for hermetically sealing MEMS using atomic layer deposition.

Technical Background

Certain electronic components, such as microelectromechanical systems (MEMS) including digital micromirror devices (DMDs) and charge-coupled devices (CCDs), may require packaging that permits the transmission of light to the device through at least one surface of the packaging, but inhibits environmental constituents of air, such as oxygen and moisture, from entering a cavity of the device packaging. Such environmental constituents could affect the operation of the MEMS.

Currently available packages may not prevent environmental constituents from affecting the device as required to meet the design life criteria of the MEMS. For example, a DMD may have a required mean time between failures (MTBF) of approximately 650,000 hours.

Accordingly, a need exists for alternative packages for electronic components that inhibit air, moisture, and the like from entering the package.

SUMMARY

According to one embodiment, an electrical component package includes a glass substrate, an interposer panel positioned on the glass substrate, the interposer panel comprising a device cavity, a wafer positioned on the interposer panel such that the device cavity is enclosed by the glass substrate, the interposer panel, and the wafer. The electrical component package further includes a metal seed layer disposed between the interposer panel and the wafer, and a dielectric coating. The dielectric coating hermetically seals the interposer panel to the glass substrate, the interposer panel to the metal seed layer and the wafer, and the interposer panel hermetically seals the metal seed layer to the glass substrate such that the device cavity is hermetically sealed from ambient atmosphere.

In another embodiment, a method of building a hermetically sealed electrical component package includes stacking an interposer panel comprising a device cavity on a glass substrate, applying a dielectric coating to the interposer panel and the glass substrate, depositing a metal seed layer on the interposer panel, and bonding a wafer to the metal seed layer deposited on the interposer panel to close the device cavity from ambient atmosphere, such that the dielectric coating and the metal seed layer hermetically seal the device cavity from ambient atmosphere.

Additional features and advantages of the hermetically sealed package described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments.

As will be discussed in greater detail below, the present disclosure is directed to electrical component packages for hermetically sealing electronic components, such as microelectromechanical systems (MEMS). MEMS may include components that degrade or become otherwise unusable over time if exposed to constituents of ambient atmosphere, for example oxygen and moisture. As one example, a digital micromirror device (DMD) may include microscopic electrical and mechanical parts mounted to a silicon substrate, such as a CMOS substrate, that could degrade given exposure to atmospheric constituents. Accordingly, MEMS, such as DMDs, may be housed in a case, also known as a "package," that supports the MEMS, electrically couples the MEMS to other components, and seals the MEMS from the ambient atmosphere to extend the life of the system.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

Packaging for a DMD, which is used to dynamically project light, must also include at least one translucent window. Projected light may shine through the window and be reflected onto an external surface by the micromirrors of the DMD. Each of the micromirrors may be mounted using components such as a yoke, a hinge, and spring tip that allow the micromirror to rotate sufficiently to change the aim of the light reflected by the micromirror such that each mirror can appear to project light or not (i.e., "on" or "off"). This allows the micromirror to project a dynamic image. The components used to control the micromirror are susceptible to degradation due to contact with environmental constituents and so packaging such components in a sealed cavity is required. Accordingly, a translucent window must be coupled to one or more other components of the packaging, such as the CMOS wafer and the assembly must be sealed.

Typical device packaging includes one or more components stacked to form a wall enclosing a device cavity that houses the MEMS. The components in the wall of the conventional packaging may be sealed using an ultraviolet (UV) cured epoxy. Because of the size of the space between molecules of the epoxy, epoxy-sealed walls may not completely prevent environmental constituents such as oxygen and moisture from entering the device cavity. Alternatively, the epoxy may contain "pinhole" breaches that allow the ingress of air and/or moisture. Accordingly, over time, the usefulness of a MEMS contained within a device package with epoxy-sealed walls will degrade. This is particularly true of MEMS applied in harsh environments, such as automobiles and outdoors.

As compared to conventional packaging, packaging that includes components sealed by a layer deposited by atomic layer deposition (an "ALD layer") may tend to better prevent environmental constituents from entering the device cavity. That is, a wall with an ALD layer may form a hermetically-sealed device cavity and extend the life of a device. Accordingly, device packages including walls sealed with an ALD layer (or layers) may be used in almost any application, including use in harsh environments, such as in automobiles and outdoors. These more robust packages may be formed using an efficient processing method known as wafer-level packaging ("WLP").

The phrase "atomic layer deposition" and "ALD" as used herein, refers to thin-film deposition technique that uses a sequence of gaseous depositions of precursors that are deposited in non-overlapping pulses. The precursors react to form a film on the surface one precursor (i.e., atom or molecule) at a time in self-limiting manner (i.e., the reaction terminates once all of the reactive sites on the surface are consumed). The thin film develops to a specified depth after repeated exposure to the gaseous precursors. Conventional packaging (e.g., packaging with one or more layers bonded by an epoxy) may allow air and other environmental constituents to penetrate the walls of the packaging because epoxy may include one or more gaps large enough to allow air through. Since ALD layers are deposited one precursor at a time, they do not include such gaps and effectively prevent the penetration of air and other environmental constituents.

Wafer-level packaging or wafer-level chip-scale packaging (WLP) is used for packaging a device (e.g., a MEMS, DMD, integrated circuit (IC), etc.) while the device is part of a wafer, in contrast to the more conventional method of slicing the wafer into individual circuits (dicing) and then packaging the device. WLP can enable integration of wafer fabrication, packaging, test, and burn-in at the wafer-level to streamline the manufacturing process undergone by a device from silicon start to customer shipment. WLP can include extending the wafer fabrication processes to include device interconnection and device protection processes. WLP involves attaching the top and bottom outer layers of packaging and the electrical bumps (i.e., solder bumps) to a device while still in the wafer and then dicing the wafer.

In the embodiments described herein, a WLP-formed electrical component package may be formed by stacking a glass substrate, an interposer panel, a metal seed layer, and a wafer, such as a CMOS wafer. The interposer panel is sealed to the glass substrate by the ALD-deposited dielectric coating which forms a hermetic seal between the translucent glass panel and the CMOS wafer. The glass panel allows light to reach the device inside the package and the CMOS wafer provides electrical interconnection with one or more external devices. In some embodiments, other layers may be including, for example and without limitation, a metal (e.g., chromium) aperture layer that prevents unwanted light from entering the packaging.

Hermetically sealing the device cavity with an ALD layer may extend the useful life of the MEMS by preventing exposure to constituents of the ambient atmosphere, such as oxygen and moisture. Further, because multiple interposer panels can be positioned on a single glass substrate and multiple MEMS can be positioned on a single wafer, an array of electrical component packages can be formed at once and then "diced" into discrete components, reducing production time and cost and thus increasing production yields.

Figure 1:
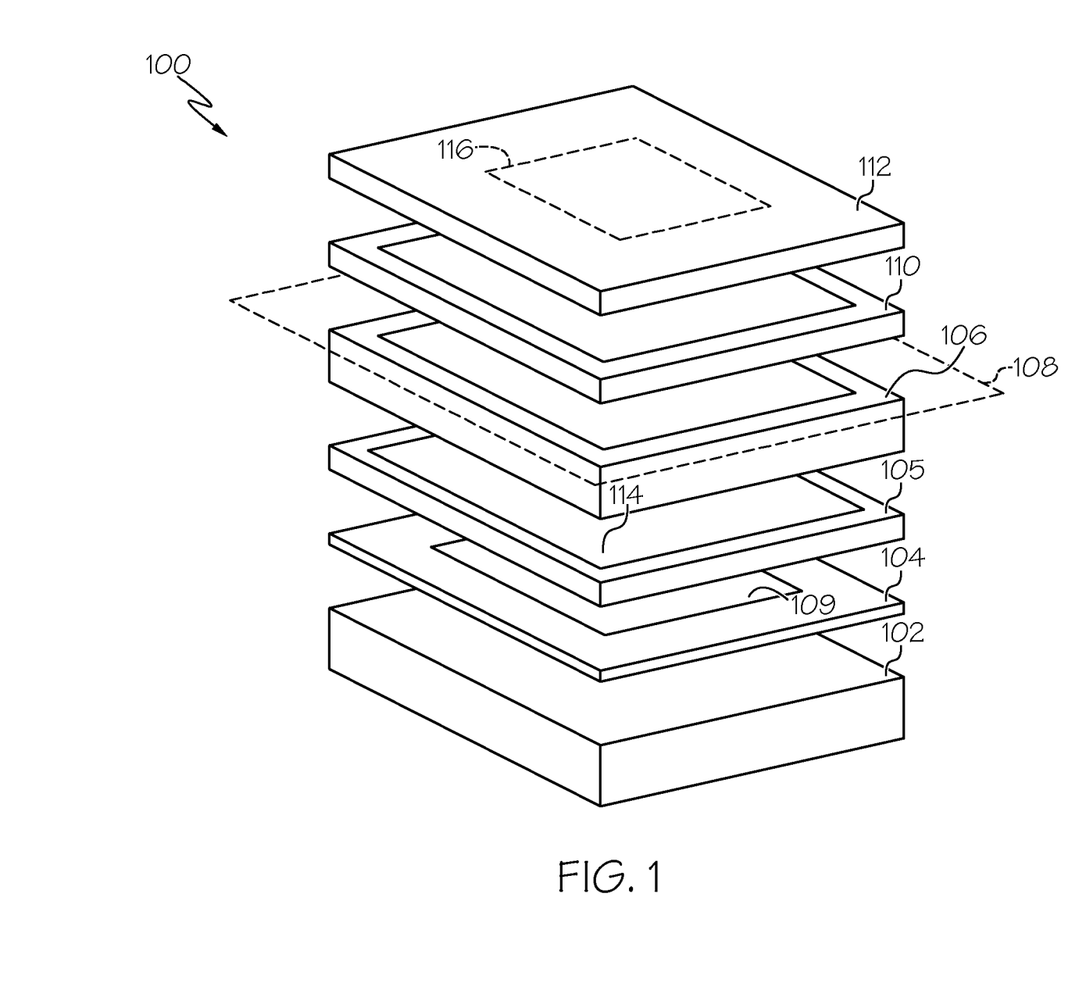
FIG. 1 illustrates an exploded view of layers for hermetically sealing an electronic component, such as a microelectromechanical system such as a DMD or a CCD, according to one or more embodiments shown and described herein.
Figure 2:
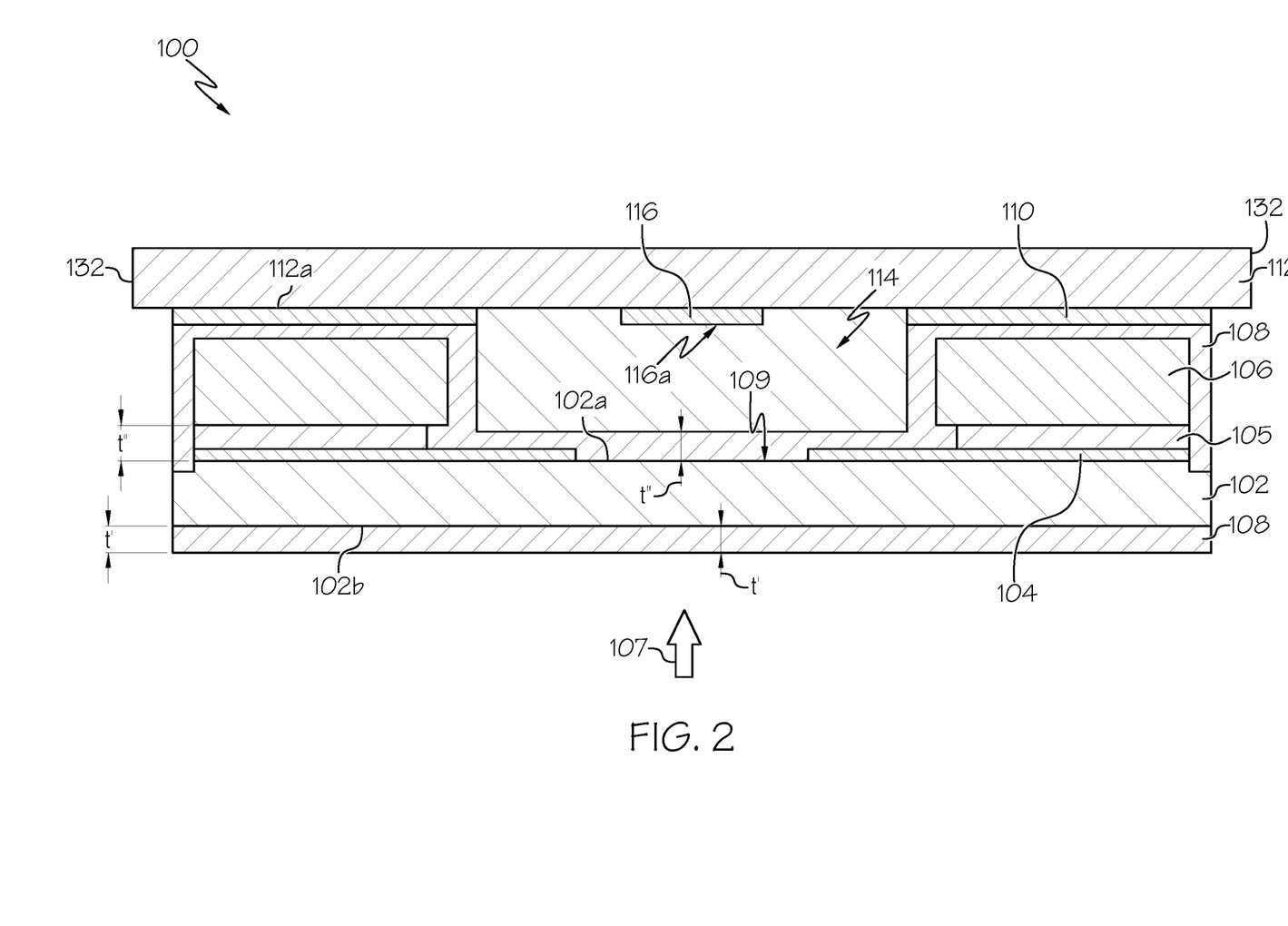
FIG. 2 illustrates a glass substrate, an epoxy layer, and an interposer panel surrounded by an ALD layer coupled to a wafer forming a hermetically sealed package around a device, according to one or more embodiments shown and described herein.

Referring now to FIGS. 1 and 2, FIG. 1 is a schematic exploded view of an illustrative embodiment of a hermetically sealed electrical component package 100 that includes a glass substrate 102, an aperture layer 104, an interposer panel 106 coupled to the glass substrate 102 with an epoxy layer 105, a dielectric coating 108 between the interposer panel 106 and a metal seed layer 110, and a wafer 112. FIG. 2 is a cross sectional view of the assembled hermetically sealed electrical component package. The interposer panel 106 surrounds a device cavity 114 enclosed by the glass substrate 102 and the wafer 112. The device cavity 114 generally houses a device 116, such as a MEMS, a DMD, a CCD, or some other type of device that is mounted to the wafer 112 inside the device cavity 114.

In some embodiments, one or more of the glass substrate 102, the aperture layer 104, the interposer panel 106, the metal seed layer 110, and the wafer 112 are fused together without any adhesives, polymer layers, coating layers or the like positioned between them. In other embodiments, one or more of the layers are coupled (e.g., adhered) together using adhesives, such as epoxy adhesives or the like.

The glass substrate 102 can have any suitable composition and be made using any suitable method. Examples of suitable glass compositions can include alkaline-earth aluminoborosilicate glasses, zinc borosilicate glasses, and soda-lime glass as well as glass ceramics, such as those enriched with magnesium oxide, yttria, beryllia, alumina, or zirconia.

In general, glass substrate 102 and any layers that may be formed in the glass substrate 102 can have any of the compositions or be made using any of the methods disclosed in U.S. Pat. No. 9,340,451 entitled "Machining of Fusion-Drawn Glass Laminate Structures Containing a Photomachinable Layer," issued May 17, 2016, U.S. Patent Application Publication No. 2017/0073266 entitled "Glass Article and Method for Forming the Same," published Mar. 16, 2017, and U.S. Provisional Patent Application No. 62/582,297, filed Nov. 6, 2017, and entitled "Precision Structured Glass Articles, Integrated Circuit Packages, Optical Devices, Microfluidic Devices, and Methods for Making the Same," each of which is hereby incorporated by reference in its entirety. However, it should be understood that other glass compositions and/or glass laminates for the glass substrate are contemplated and possible. In some embodiments, the glass substrate 102 may have a thickness between 0.1 and 1.7 mm. In some embodiments, the glass substrate 102 may have a thickness between 0.2 and 1.6 mm. In some embodiments, the glass substrate may have a thickness between 0.3 and 1.5 mm. In some embodiments, the glass substrate may have a thickness between 0.5 and 1.3 mm. In some embodiments, the interposer layer may have a thickness between 0.05 and 0.45 mm. In some embodiments, the interposer layer may have a thickness between 0.1 and 0.4 mm. In some embodiments, the interposer layer may have a thickness between 0.15 and 0.35 mm.

The aperture layer 104 may be formed on at least one surface of the glass substrate 102. For example, in the embodiment depicted in FIG. 1, the aperture layer 104 is disposed on the glass substrate 102 between the interposer 106 and the glass substrate 104. The aperture layer 104 may prevent unwanted light from reaching the device 116. For example, in the case where the MEMS is a DMD, the aperture layer 104 may allow only the light that will reflect off of the one or more micromirrors of the DMD to pass through the device external layers of the device to reach the one or more micromirrors. That is, the aperture layer 104 only allows light to pass through the aperture 109 formed in the aperture layer 104. Accordingly, portions of the aperture layer 104 may be opaque and/or reflective of light. In embodiments, the aperture layer 104 may comprise a chromium aperture. In yet other embodiments, the aperture layer 104 may comprise silver, gold, tungsten, tin, copper, platinum, or some other metal. In some embodiments, the aperture layer may have a thickness between 100 and 600 nm. In some embodiments, the aperture layer may have a thickness between 200 and 500 nm. In some embodiments, the aperture layer may have a thickness between 300 and 400 nm.

The illustrated interposer panel 106 of the hermetically sealed electrical component package 100 may extend between the glass substrate 102 and the wafer 112 and form the device cavity 114 for housing the device 116. The interposer panel 106 may be formed from one or more of silicon, silicon-dioxide, or any other suitable material. The interposer panel 106 may be coupled on the glass substrate 102 using and epoxy, such as a UV-cured epoxy, for example, the epoxy layer 105.

As shown in FIG. 2, the dielectric coating 108 may encapsulate the interposer panel 106, the epoxy layer 105, and the aperture layer 104 to hermetically seal the interposer panel 106 to the glass substrate 102, thereby sealing the interposer panel 106, the epoxy layer 105, and the aperture layer 104 together and forming the hermetically sealed device cavity 114. In embodiments, the dielectric coating 108 may be applied to at least a portion of the top surface 102a and at least a portion of the bottom surface 102b of the glass substrate 102. In some embodiments, the dielectric coating 108 may comprise multiple layers of material with different indices of refraction. These layers may form an optical filter for filtering or reflecting certain wavelengths of incident light 107. For example, and without limitation, the dielectric coating 108 may comprise a low-band and/or a high-band optical filter. In one or more embodiments, the dielectric coating may comprise a multi-layer optical coating that can be one or more of an anti-reflection filter, a UV-cut filter, and/or a UV-infrared (IR) cut filter. Additionally or alternatively, the dielectric coating 108 can be any band-pass, band reject, low-pass, or high-pass optical coatings.

In some embodiments, the dielectric coating 108 may be a coating stack. The coating stack may comprise one or more layers having different indices of refraction. For example, one exemplary coating stack may include alternating high-index and low-index optical materials. Low index materials may include, but are not limited to: $MgF_2$, $SiO_2$. High index materials may include, but are not limited to: $HfO_2$, $TiO_2$, $Nb_2O_5$, $ZrO_2$, $Y_2O_3$. In some embodiments, an exemplary coating stack may include one or more mid-index materials.

Mid-index materials may include, but are not limited to: $Al_2O_3$. In some embodiments, a coating stack may include one or more of the following: $AlF_3$, $ZnO$, $Ta_2O_5$, $In_2O_3$, $SnO_2$, $LaF_3$, $GdF_3$.

The dielectric coating 108 may have a uniform thickness across one or more exposed surfaces of the electrical component package 100 or may have a non-uniform thickness across the one or more exposed surfaces. For example, in some embodiments, the dielectric coating 108 may be applied with thicknesses t', t'' that vary along the external surfaces of the electrical component packages 100 on which the dielectric coating 108 is applied such that the angular intensity of incident light 107 is affected. In some embodiments, the thickness of the dielectric coating is between 200 and 1000 nm. In some embodiments, the thickness of the dielectric coating is between 300 and 900 nm. In some embodiments, the thickness of the dielectric coating is between 500 and 700 nm.

As noted herein, the dielectric coating 108 may be applied using a chemical vapor deposition (CVD) process, such as, for example, atomic layer deposition (ALD), or some other type of chemical deposition. In some embodiments, a vapor phase silicon precursor is used in concert with a vapor phase oxygen precursor to deposit one or more layers of the dielectric coating 108. Various vapor phase silicon precursors and oxygen precursors may be used to deposit the layers of the dielectric coating 108. One example combination of silicon precursor and oxygen precursor includes Tris(dimethylamido)silane (TDMAS) combined with $O_3$. Other silicon precursors include, but are not limited to, Bis(diethylamino)silane (BDEAS), and SAM-24. In yet other embodiments, a hafnium vapor phase precursor is used in concert with an oxygen vapor phase precursor to deposit one or more layers of the dielectric coating 108. For example, Tetrakis(dimethylamino)hafnium(IV) (TDMAH) may be reacted with $H_2O$ to deposit a layer of the the dielectric coating 108. In yet other embodiments, a magnesium vapor phase precursor may be used in combination with a fluorine vapor phase precursor. Exemplary magnesium precursors include, but are not limited to, $Mg(thd)_2$, Bis(cyclopentadienyl)magnesium, Bis(pentamethylcyclopentadienyl) magnesium, and Bis(ethylcyclopentadienyl)magnesium. Exemplary fluorine precursors include, but are not limited to, HF, $NF_3$, $CF_4$, $SF_6$, $TaF_5$, $TiF_4$, and $NH_4F$.

Figure 3A:
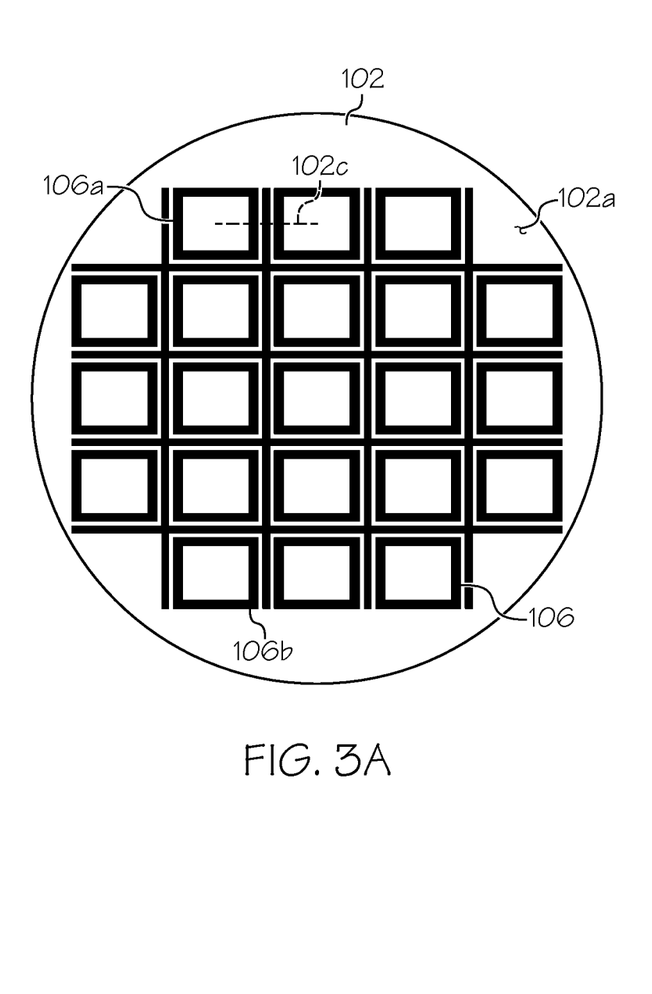
FIG. 3A illustrates a top surface of a glass substrate panel that includes the glass substrate of FIG. 2, according to one or more embodiments shown and described herein.
Figure 3B:
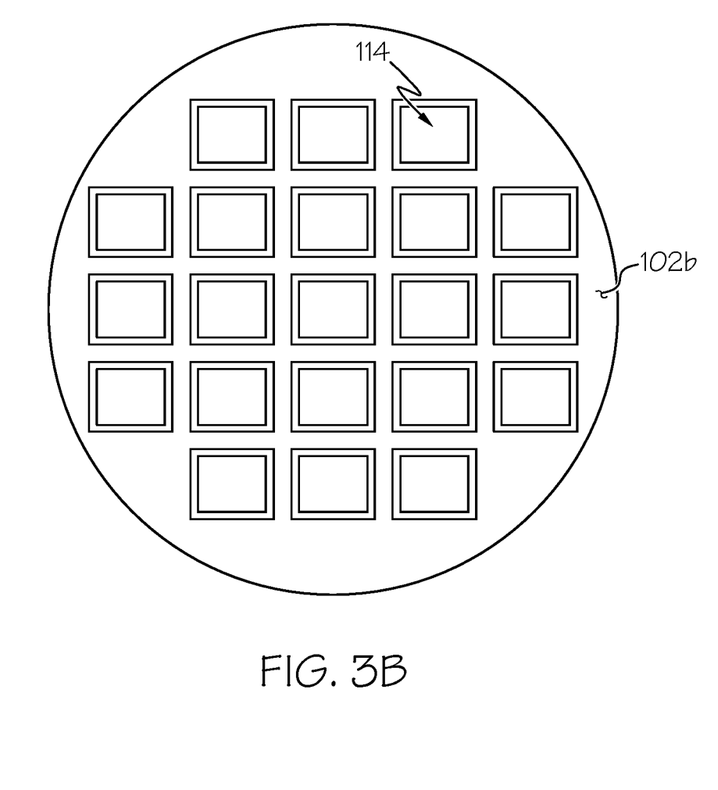
FIG. 3B illustrates a bottom surface of the glass substrate panel of FIG. 3A, according to one or more embodiments shown and described herein.

The dielectric coating 108 may be applied to the internal and external surfaces of the interposer panel 106, the epoxy layer 105, the aperture layer 104, and the glass substrate 102 such that it surrounds and encapsulates these components, which together form the device cavity 114. Briefly referring to FIGS. 2 and 3, an array of aperture layers 104, epoxy layers 105, interposer panels 106, and the dielectric coating 108 may be applied to the glass substrate 102 to form a plurality of electrical component packages 100 on the glass substrate at the same time. Each of the top surface 102a and the bottom surface 102b of the glass substrate (and any additional layers deposited thereon) may then be coated with the dielectric coating to form multiple device cavities 114. FIG. 3A shows the top surface 102a of the illustrative glass substrate 102 and FIG. 3B shows the bottom surface 102b of the illustrative glass substrate before the glass substrate 102 has been coupled with the wafer 112 and diced into individual electrical component packages 100. That is, the view shown in FIG. 3A shows several interposer panels 106 stacked on the top surface 102a of the glass substrate 102 and FIG. 3B shows the aperture layer 104 through the bottom surface 102b of the transparent glass substrate 102.

Referring again to FIGS. 1 and 2, the metal seed layer 110 may be deposited on the dielectric coating 108. In embodiments, the metal seed layer 110 may be deposited using physical vapor deposition (PVD) such as sputtering, plasma sputtering, or ion deposition sputtering, evaporation, electroplating, chemical vapor deposition (CVD), or atomic layer deposition (ALD). In some embodiments, the metal seed layer 120 may include one or more of palladium, platinum, gold, silver, aluminum, titanium, chromium, iron, cobalt, nickel, copper, and zinc. The interface between the metal seed layer 110 and the dielectric coating 108 may be impervious to penetration by environmental constituents of air, such as moisture and oxygen, such that, when the metal seed layer 110 is applied to the dielectric coating 108, the interface between the metal seed layer 110 and the dielectric coating 108 inhibit environmental constituents from entering the device cavity 114, thereby hermetically sealing the device cavity 114.

The wafer 112 (also referred to as a "substrate," "wafer substrate," or "CMOS wafer" (although this "CMOS" refers to merely one type of wafer for convenience and embodiments are not limited to a CMOS wafer)) may comprise a semiconductor material such as silicon or silicon-dioxide. In some embodiments, the wafer 112 is a CMOS wafer. The wafer 112 may be bonded to the metal seed layer 110 using a wafer-to-die bonding technique at a first side 112a. Non-limiting examples of bonding techniques include soldering, brazing, fusion bonding, eutectic bonding, and the like. In one exemplary embodiment, the wafer 112 is bonded to the metal seed layer 110 using a Si-gold (Au) eutectic bonding process. In some embodiments, the wafer 112 may include an overhang 132 for electrically coupling the wafer 112 with an external component.

Still referring to FIG. 1, the wafer 112 may comprise the device 116. Specifically, the device 116 may be coupled to a first side 112a of the wafer 112 and is positioned within the device cavity 114 when the wafer 112 is attached to the interposer panel 106 by the metal seed layer 110 and the dielectric coating 108. As described above, the device may be any electrical component including, without limitation, electromechanical devices or systems, such as digital micromirror display (DMD) devices, or CCD devices. In embodiments in which the device 116 is a DMD, the external surface 116a which includes the mirrors of the DMD, may face the glass substrate 102 such that incident light 107 passes through the glass substrate 102 and is reflected by the device 116 back out of the electrical component package 100.

Referring now to FIGS. 3A-10, an exemplary method of forming the electrical component package 100 of FIGS. 1 and 2 will be described. FIG. 3A shows a top view of multiple interposer panels 106 stacked on top of the glass substrate 102 to form a plurality of interposer panel rows 106a and interposer panel columns 106b. The wafer 112 is not shown in FIG. 3A because it will be added in a subsequent step. The interposer panel rows 106a of multiple interposer panels 106 are diced to form a hermetically sealed electrical component package once the device stack is completed and a wafer 112 has been coupled to the device stack.

Figure 4:
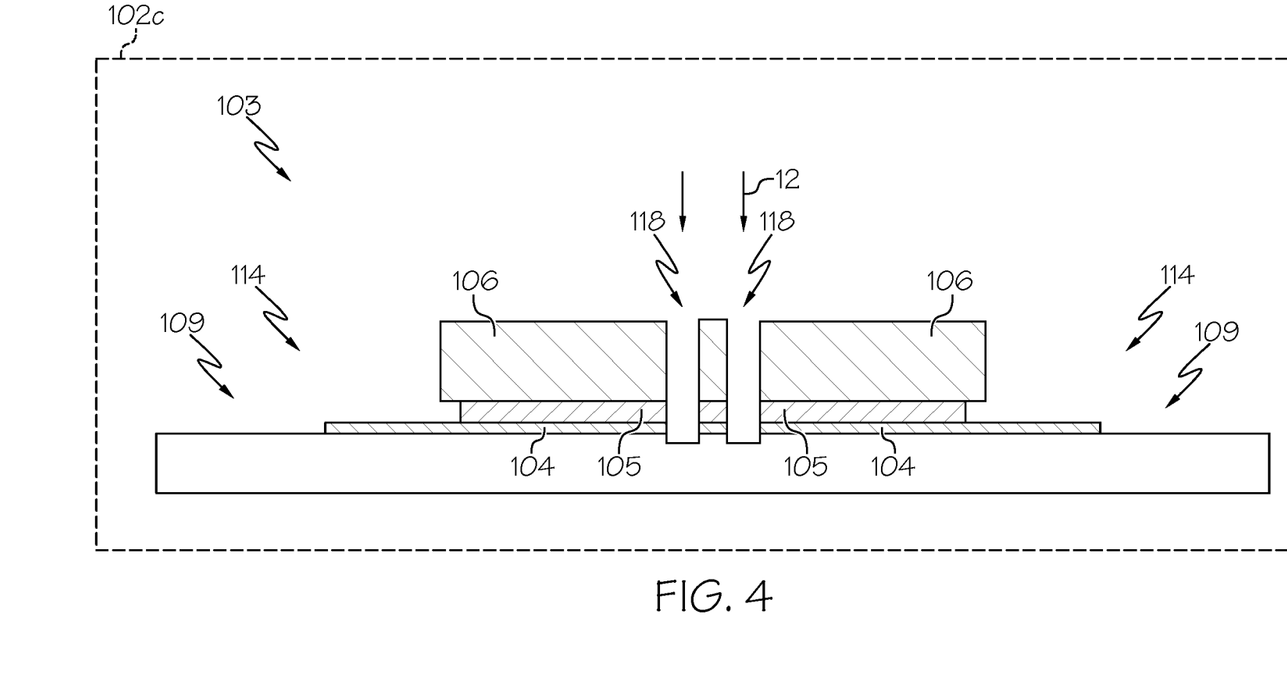
FIG. 4 illustrates the glass substrate and interposer panel of FIG. 2 including an epoxy layer, according to one or more embodiments shown and described herein.
Figure 5:
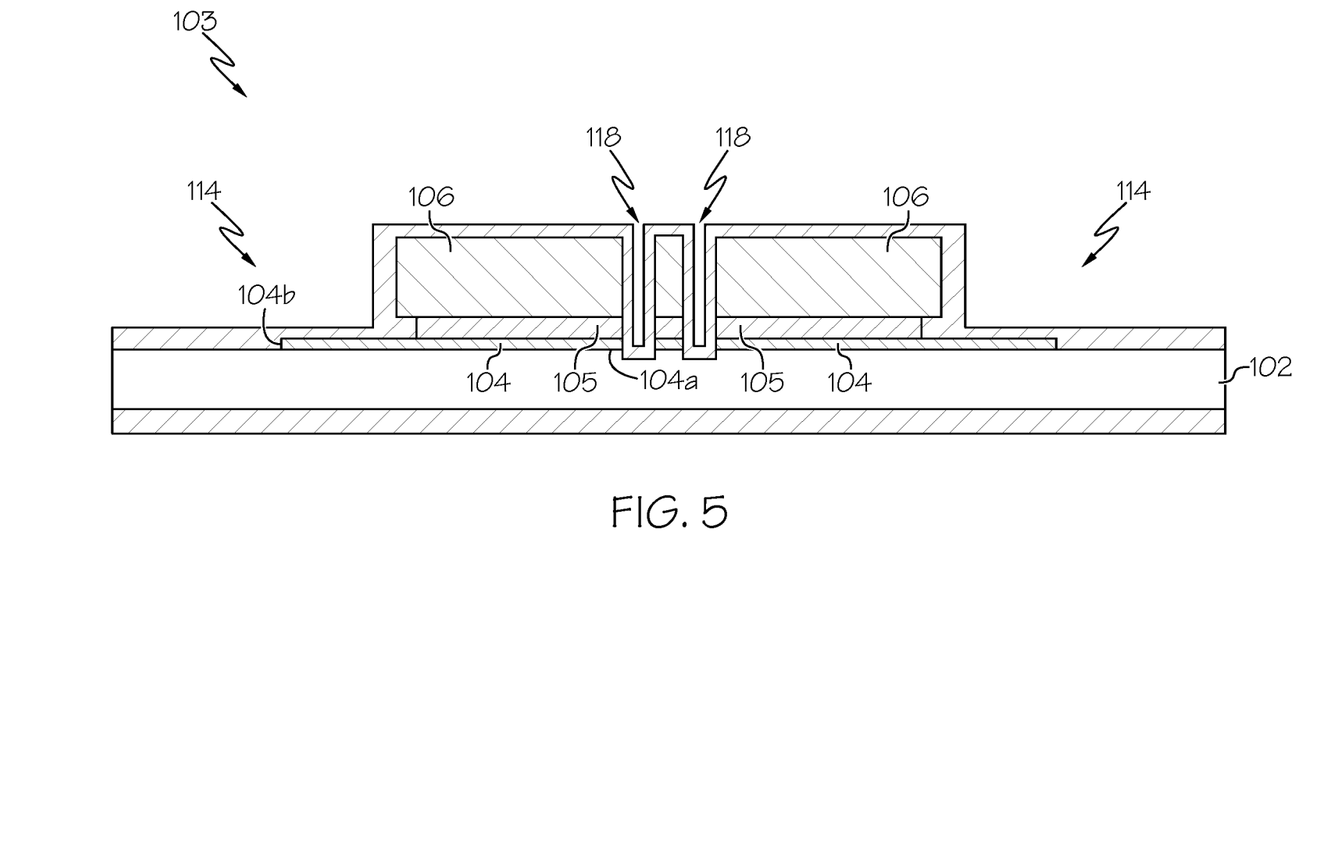
FIG. 5 illustrates the interposer panel and glass substrate of FIG. 4 including a dielectric coating enclosing the interposer panel and the glass substrate, according to one or more embodiments shown and described herein.

FIG. 4 shows a side view of the indicated portion 102c (FIG. 3A) of the glass substrate 102. The indicated portion 102c is an interface between what is to become the left and right sides of separate electrical component packages 100. As shown in FIG. 4, the interposer panels 106 may be coupled to the glass substrate 102 through one or more of the aperture layer 104 and the epoxy layer 105 to form a glass substrate panel 103. Briefly referring to both FIGS. 3A and 4, each interposer panel row 106a is double diced between horizontally-adjacent interposer panels 106 as indicated by double arrows 12 to form two parallel gaps 118 between adjacent interposer panels 106. The glass substrate 102 may be diced using any method for dicing a silicon wafer, including, for example, scribing and breaking, mechanical sawing, laser cutting. Each interposer panel column 106b may also be doubled diced between vertically-adjacent interposer panels 106 forming parallel gaps similar to parallel gaps 118 between vertically-adjacent interposer panels. The double dicing between adjacent interposer panels 106 on the glass substrate 102 creates a space for the deposition of the dielectric coating 108 such that each interposer panel 106 can be encapsulated by the dielectric coating 108. Once the two parallel gaps 118 have been formed to form the individual interposer panels 106, the dielectric coating 108 may be applied to the external surfaces of the glass substrate panel 103 as shown in FIG. 5.

The dielectric coating 108 may be applied using ALD, CVD, or some other chemical deposition process as described above. In some embodiments, the dielectric coating may comprise multiple coating layers, including layers having varying optical properties. The dielectric coating is applied to external surfaces of the glass substrate panel 103 and forms the device cavity 114 that is hermetically sealed. As shown in FIG. 5, the dielectric coating 108 may extend beneath an interface 104a between the glass substrate 102 and the aperture layer 104 to ensure a hermetic seal at the interface between the aperture layer 104 and the glass substrate 102. Additionally, the dielectric coating may be applied at an internal interface 104b between the aperture layer 104 and the glass substrate 102 ensuring that the aperture layer 104 maintains contact with the glass substrate 102.

Figure 6:
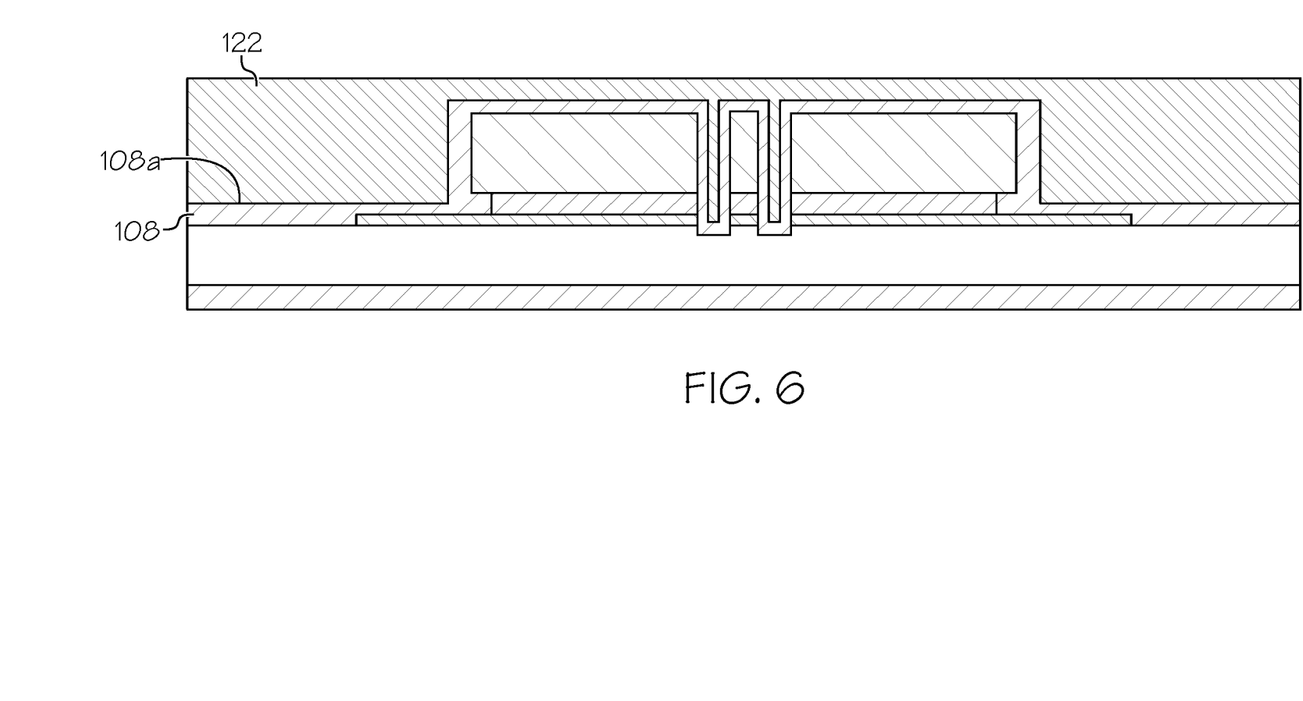
FIG. 6 illustrates the interposer panel, the glass substrate, and the dielectric coating of FIG. 5 including a photosensitive polymer layer, according to one or more embodiments shown and described herein.

Referring now to FIG. 6, once the dielectric coating 108 is applied to the glass substrate 102, a photosensitive polymer layer 122 may be temporarily applied over a top surface 108a of the dielectric coating 108. The photosensitive polymer layer 122 may comprise a layer of one or more of an evaporated glass, a polymer, one or more photo resists, one or more polyimides, and other suitable layers for preventing the metal seed layer 110 from depositing on surfaces covered by the photosensitive polymer layer 122 as the metal seed layer 110 is applied. The photosensitive polymer layer 122 may be deposited using a spin-coating technique or some other appropriate coating technique.

Figure 7:
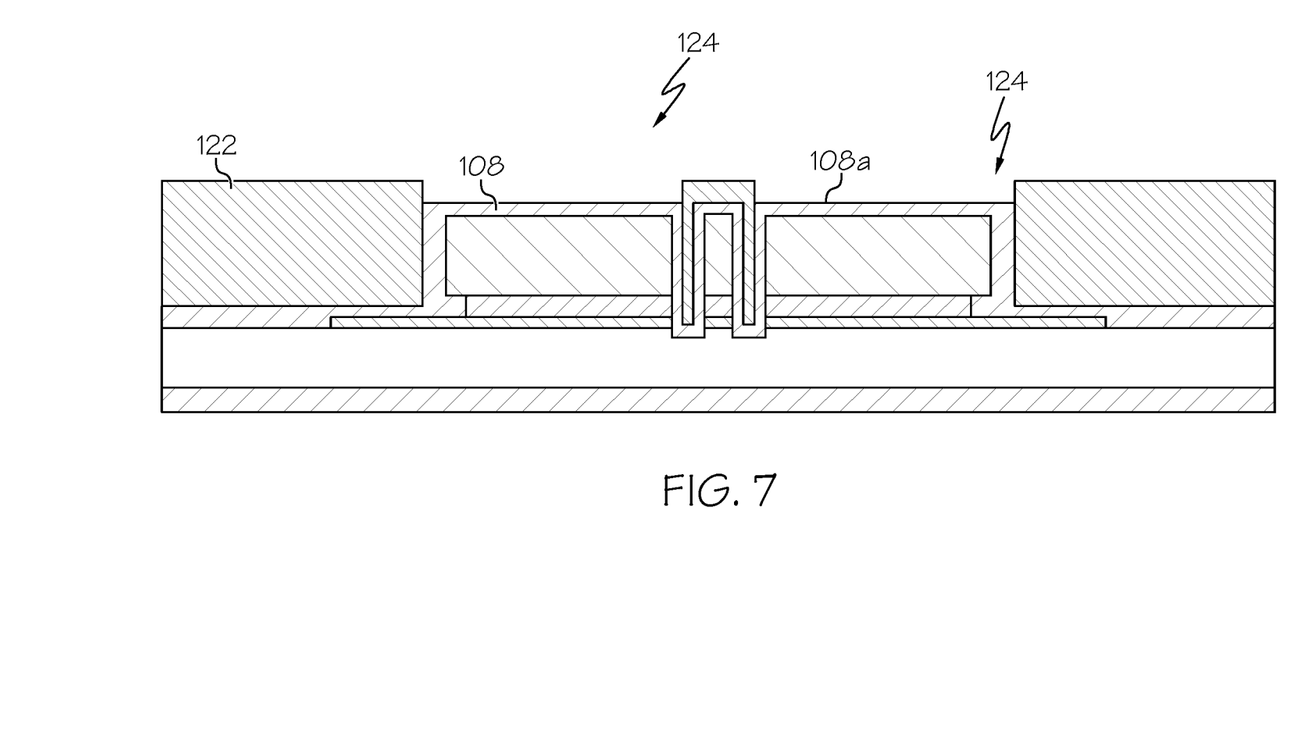
FIG. 7 illustrates the interposer panel, the glass substrate and the dielectric coating of FIG. 6 with a portion of the photosensitive polymer layer over the dielectric coating removed, according to one or more embodiments shown and described herein.

Referring now to FIG. 7, one or more portions 124 of the photosensitive polymer layer 122 are removed from the assembly in preparation for deposition of the metal seed layer 110. In some embodiments, the portions 124 of the photosensitive polymer layer 122 that are removed are the portions of the photosensitive polymer layer 122 that cover the top surface 108a of the dielectric coating 108 where the metal seed layer 110 is to be deposited. These portions 124 removed are removed using photolithography. Specifically, the photosensitive polymer layer 122 is removed such that the top surface 108a of the dielectric coating 108 over the interposer panel 106 is exposed such that the metal seed layer 110 can be deposited on the top surface 108a of the dielectric coating 108. Portions of the photosensitive polymer layer 122 that are not over the top surface 108a of the dielectric coating 108 are not removed such that the metal that makes up the metal seed layer 110 is not inadvertently deposited.

Figure 8:
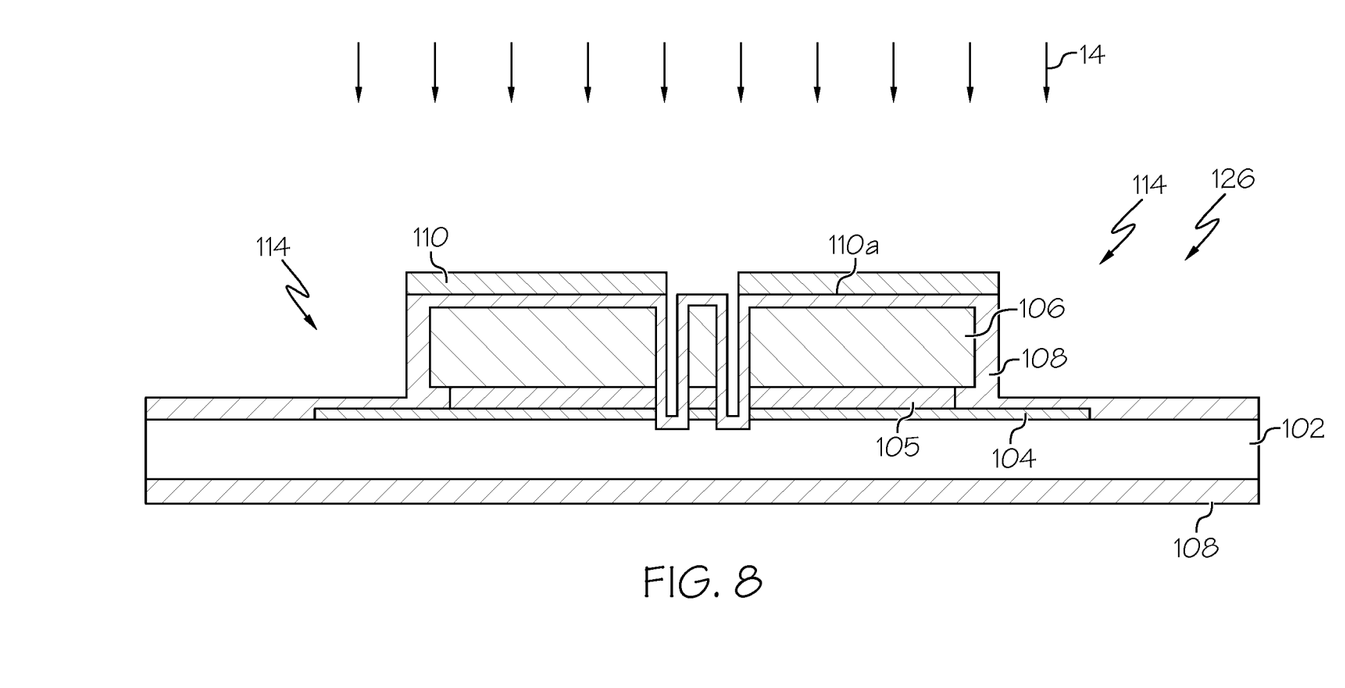
FIG. 8 illustrates a metal seed layer over the dielectric coating of FIG. 7, according to one or more embodiments shown and described herein.

Referring to FIGS. 7 and 8, once the portions 124 of the photosensitive polymer layer 122 are removed, the metal seed layer 110 is placed over the top surface 108a of the dielectric coating 108. The metal seed layer 110 may comprise, for example, and without limitation, Ti/Cu alloys, NiCr alloys, and/or nickel-based alloys such as Inconel. The bonds between the metal seed layer 110 and the dielectric coating 108 may be such that environmental constituents such as moisture and oxygen may be prevented from entering the device cavity 114 at the interface 110a between the metal seed layer 110 and the dielectric coating 108.

With the metal seed layer 110 in place on top of the dielectric coating 108, the photosensitive polymer layer 122 may be removed using a chemical or photo etching process indicated by arrows 14. Removing the photosensitive polymer layer 122 reopens the device cavity 114 and leaves the dielectric coating 108 in place with the metal seed layer 110 over the dielectric coating 108. As shown in FIG. 8, the glass substrate 102, the interposer panel 106, the dielectric coating 108, and the metal seed layer 110 form a glass substrate assembly 126.

Figure 9:
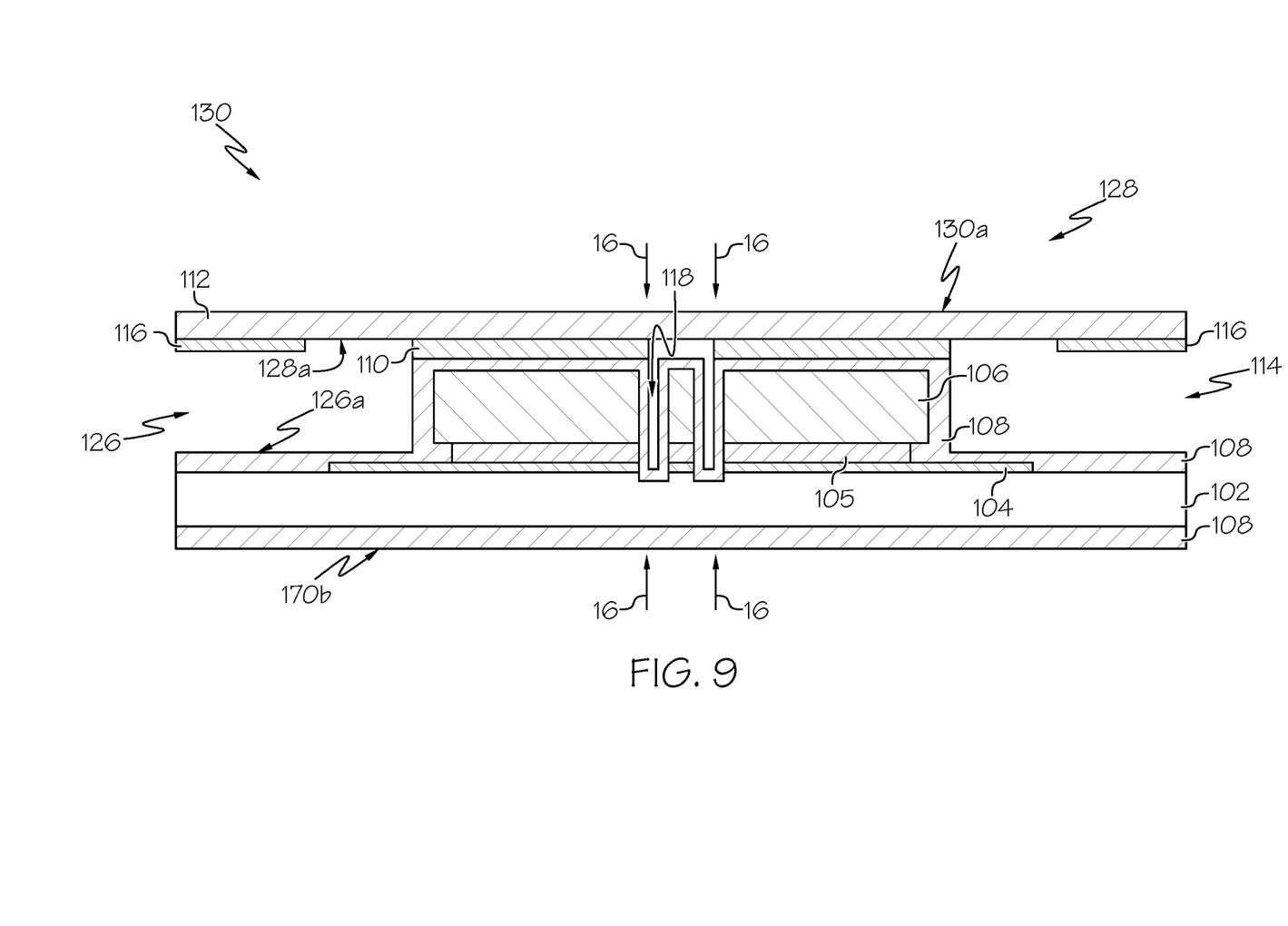
FIG. 9 illustrates a wafer including a device over the metal seed layer of FIG. 8, according to one or more embodiments shown and described herein.
Figure 10:
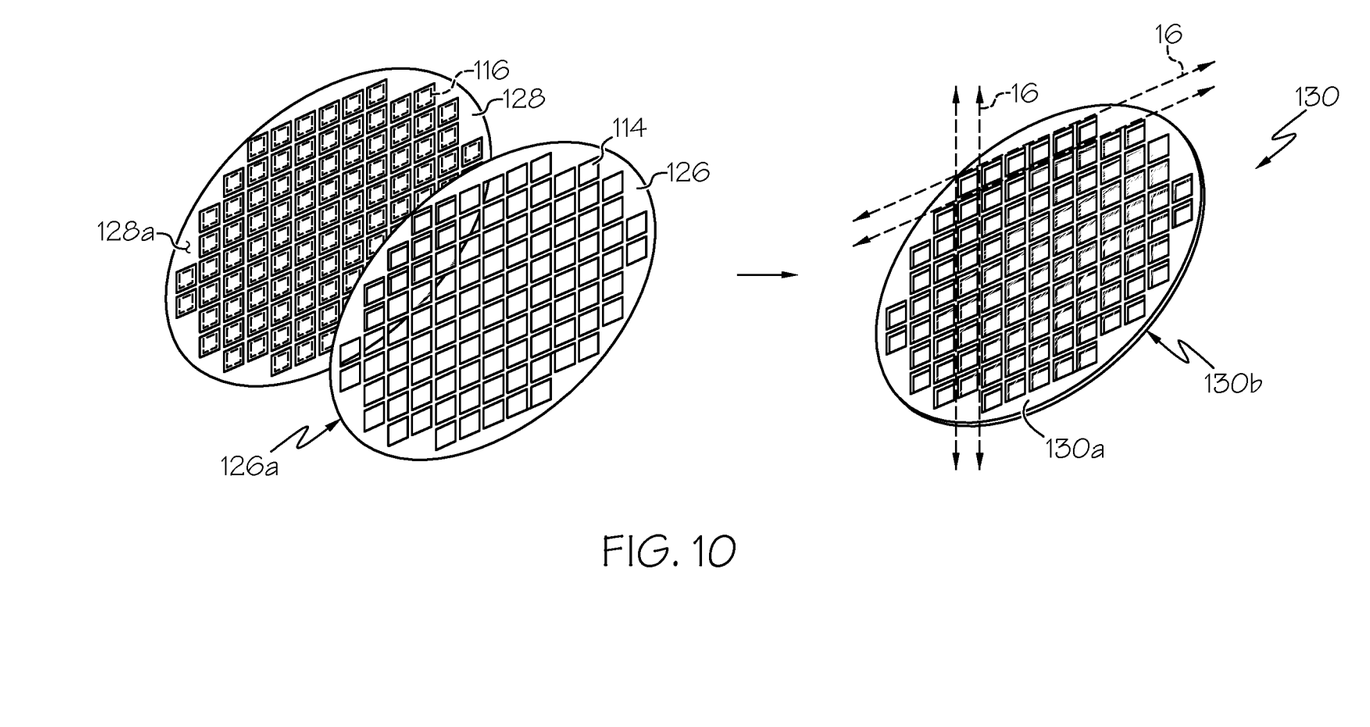
FIG. 10 illustrates a wafer-level package including a plurality of hermetically sealed electrical component packages formed by stacking the glass substrate, interposer panel, and dielectric coating with the wafer of FIG. 2, according to one or more embodiments shown and described herein.

Referring to FIG. 9, a wafer assembly 128 includes the wafer 112 and the device 116. FIG. 10 schematically depicts an array of device cavities 114 formed by the array of interposer panels 106 on an interior side 126a of the glass substrate assembly 126 joined with an array of devices 116 positioned on an interior side 128a of the wafer assembly 128. The glass substrate assembly 126 is aligned with the wafer assembly 128 such that each device cavity 114 includes one device 116. As shown in FIG. 9, the wafer assembly 128 may be bonded to the metal seed layer 110. The wafer assembly 128 may be bonded using any bonding technique as described herein. For example, the wafer assembly 128 may be bonded to the metal seed layer 110 using eutectic bonding. Bonding the glass substrate assembly 126 to the wafer assembly 128 forms a hermetically sealed wafer assembly 130 that includes an array of hermetically sealed electrical component packages 100 enclosing an array of devices 116 within an array of hermetically sealed device cavities 114.

To separate each of the electrical component packages 100 into individual device packages, the hermetic wafer assembly 130 is diced on the glass substrate assembly 126 side and the wafer assembly 128 side in two perpendicular directions as indicated by arrows 16 in FIGS. 9 and 10. The hermetic wafer assembly 130 may be diced using any method for dicing a wafer, including, for example, scribing and breaking, mechanical sawing, laser cutting. The hermetic wafer assembly 130 is diced from the top surface 130a and the bottom surface 130b of the hermetic wafer assembly 130. Dicing the hermetic wafer assembly 130 separates the array of hermetically sealed electrical component packages into individual hermetically sealed electrical component packages 100. Briefly referring to FIG. 2, in some embodiments, the wafer assembly 130 may be diced on the top surface 130a such that the overhang 132 extends outward from the side of the wafer 112, leaving space for an electrical interconnection between the device 116 and one or more other devices.

It should now be understood that an ALD layer can be used to encapsulate an interposer panel to a glass substrate to form a hermetically sealed device cavity. The ALD layer may be disposed between a glass substrate and a wafer that includes a device, such as a DMD or a CCD. The deposition of layers of individual precursors using the ALD process creates a seal without pin-hole leaks that prevents oxygen, moisture, and other environmental constituents from entering the hermetically sealed device cavity.

It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. An electrical component package comprising:
   a glass substrate;
   an interposer panel positioned on the glass substrate, the interposer panel comprising a device cavity;
   a wafer positioned on the interposer panel such that the device cavity is enclosed by the glass substrate, the interposer panel, and the wafer;
   a metal seed layer disposed between the interposer panel and the wafer; and
   a dielectric coating, wherein the dielectric coating is an anti-reflective filter disposed on an external surface of the glass substrate, wherein the dielectric coating comprises at least a high optical index material and a low optical index material, and wherein the dielectric coating hermetically seals:
   the interposer panel to the glass substrate; and
   the interposer panel to the metal seed layer; and
   wherein the interposer panel hermetically seals the metal seed layer to the glass substrate such that the device cavity is hermetically sealed from ambient atmosphere.

2. The electrical component package of claim 1, wherein at least a portion of the dielectric coating is disposed on at least a portion of a surface of the glass substrate within the device cavity.

3. The electrical component package of claim 1, wherein at least a portion of the dielectric coating is disposed on sidewalls of the device cavity formed by the interposer panel.

4. The electrical component package of claim 3, wherein at least a portion of the dielectric coating is disposed between the interposer panel and the glass substrate.

5. The electrical component package of claim 4, wherein the portion of the dielectric coating disposed between the interposer panel and the glass substrate is within the device cavity.

6. The electrical component package of claim 5, wherein the portion of the dielectric coating disposed between the interposer panel and the glass substrate is contiguous with the dielectric coating that is disposed on the sidewalls of the device cavity formed by the interposer panel.

7. The electrical component package of claim 1, wherein the dielectric coating is disposed on an external surface of the glass substrate that is opposite the wafer.

8. The electrical component package of claim 1, wherein a chromium aperture and an epoxy layer are disposed between the interposer panel and the glass substrate.

9. The electrical component package of claim 8, wherein the chromium aperture is disposed directly on a surface of the glass substrate in the device cavity.

10. The electrical component package of claim 8, wherein the epoxy layer comprises an epoxy layer aperture.

11. The electrical component package of claim 1, wherein the dielectric coating on the external surface of the glass substrate comprises alternating high optical index materials and low optical index materials.

* * * * *